(12) United States Patent
Lee et al.

(10) Patent No.: US 9,350,341 B2
(45) Date of Patent: May 24, 2016

(54) GATE DRIVER, SWITCH CONTROL CIRCUIT AND POWER SUPPLY DEVICE COMPRISING THE GATE DRIVER CIRCUIT

(71) Applicant: FAIRCHILD KOREA SEMICONDUCTOR LTD., Bucheon-si (KR)

(72) Inventors: Won-Tae Lee, Cheonan-si (KR); Kyung-Oun Jang, Bucheon-si (KR); Sung-Won Yun, Seoul (KR); Min-Woo Lee, Bucheon-si (KR)

(73) Assignee: Fairchild Korea Semiconductor LTD (KR)

( * ) Notice: Subject to any disclaimer, the term of this patent is extended or adjusted under 35 U.S.C. 154(b) by 7 days.

(21) Appl. No.: 14/301,970

(22) Filed: Jun. 11, 2014

(65) Prior Publication Data

US 2014/0368254 A1   Dec. 18, 2014

(30) Foreign Application Priority Data

Jun. 18, 2013   (KR) .......................... 10-2013-0069928

(51) Int. Cl.
  *H03K 17/16*   (2006.01)
(52) U.S. Cl.
  CPC .................................... *H03K 17/165* (2013.01)

(58) Field of Classification Search
  CPC . H01L 22/00; H01L 22/34; H01L 2924/3011; H03F 3/00; H03F 3/72; H03K 17/00; H03K 17/145; H03K 17/165; H03K 19/00; H03K 19/00384
  USPC .......................................................... 327/378
  See application file for complete search history.

(56) References Cited

U.S. PATENT DOCUMENTS

| | | | |
|---|---|---|---|
| 6,803,803 B1* | 10/2004 | Starr et al. ..................... | 327/378 |
| 2011/0241738 A1* | 10/2011 | Tamaoka ....................... | 327/109 |
| 2012/0043950 A1* | 2/2012 | Truong et al. ................. | 323/282 |
| 2012/0286752 A1* | 11/2012 | Tsukiji et al. ................. | 323/282 |

\* cited by examiner

*Primary Examiner* — John Poos
*Assistant Examiner* — David Mattison
(74) *Attorney, Agent, or Firm* — Grossman Tucker Perreault & Pfleger PLLC

(57) ABSTRACT

The present invention relates to a gate driving circuit, a switch control circuit including the gate driving circuit, and a power supply. The gate driving circuit generates a gate voltage of the power switch. The gate driving circuit includes: a delay control circuit generating a first control signal that controls a rising slope of the gate voltage at a first time after a first delay period is passed from a rising time of the gate voltage and generating a second control signal that controls the rising slope of the gate voltage at a time after a second delay period is passed from the first time; and a temperature compensation circuit that varies the first delay period according to a temperature.

24 Claims, 8 Drawing Sheets

GATE DRIVER, SWITCH CONTROL CIRCUIT AND POWER SUPPLY DEVICE COMPRISING THE GATE DRIVER CIRCUIT

CROSS-REFERENCE TO RELATED APPLICATION

This application claims priority to and the benefit of Korean Patent Application No. 10-2013-0069928 filed in the Korean Intellectual Property Office on Jun. 18, 2013, the entire contents of which are incorporated herein by reference.

BACKGROUND (a) Field

Embodiments relate to a gate driving circuit, and a switch control circuit and a power supply including the gate driving circuit.

(b) Description of the Related Art

A conventional power supply has a problem of generating electro magnetic interference (EMI) due to hard switching. Conventional arts suggested to reduce the EMI solve conduction EMI, and, for example, include, a frequency jittering method that reduces EMI by changing a frequency.

However, the frequency jittering method cannot sufficiently solve a radiation EMI problem. Thus, an EMI filter is added to the power supply.

The above information disclosed in this Background section is only for enhancement of understanding of the background of the invention and therefore it may contain information that does not form the prior art that is already known in this country to a person of ordinary skill in the art.

SUMMARY

Embodiments have been made in an effort to provide a gate driving circuit that can reduce EMI, a switch control circuit, and a power supply.

A gate driving circuit generating a gate voltage of a power switch according to an embodiment includes: a delay control circuit generating a first control signal that controls a rising slope of the gate voltage at a first time after a first delay period is passed from a rising time of the gate voltage and generating a second control signal that controls the rising slope of the gate voltage at a time after a second delay period is passed from the first time; and a temperature compensation circuit that varies the first delay period according to a temperature.

The delay control circuit includes a first delay circuit generating a second input signal by delaying a first input signal that corresponds to a pulse width control signal controlling a switching operation of the power switch by the first delay period and a second delay circuit generating a third input signal by delaying the second input signal by the second delay period. The delay control circuit generates the first control signal according to the second input signal and an inverse input signal that is inverted from the first the second input signal and generates the second control signal according to the first input signal and the third input signal.

The delay control circuit further includes a first logic gate enabling the first control signal when both of the inverse input signal and the second input signal are in a first level and a second logic gate enabling the second control signal when both of the first input signal and the third input signal are in a second level.

The first logic gate is an NOR gate and the second logic gate is an AND gate, and the first level is low level, the second level is high level, and an enable level is high level.

The gate driving circuit further includes a level shifter generating a pulse width voltage by level-shifting the pulse width control signal, and the delay control circuit further includes a first inverter receiving the pulse width voltage and inverting the pulse width voltage and a second inverter generating the first input signal by receiving an output of the first inverter and inverting the output of the first inverter.

The temperature compensation circuit includes: a variable resistor of which resistance is varied according to a temperature; an operation amplifier amplifying a difference between a voltage generated in the variable resistor and a predetermined bias voltage and outputting the amplified difference; a transistor including a gate to which an output of the operation amplifier is supplied and a first electrode coupled to the variable resistor; and a first current mirror circuit coupled to a second end of the transistor and generating a temperature detection signal by mirroring a current flowing to the transistor.

The first delay circuit generates a plurality of driving currents by mirroring the temperature detection signal and controls the first delay period according to the plurality of driving currents.

The first delay circuit includes: a second current mirror circuit mirroring the temperature detection signal; a third current mirror circuit generating the plurality of driving currents by mirroring the current mirrored by the second current mirror circuit; and a delay generation means determining the first delay period by controlling a plurality of output delays using the plurality of driving currents and a plurality of capacitors, receiving the first input signal, and outputting the second input signal.

The delay generation means includes a plurality of inverters, respectively receiving the plurality of driving currents, and an input end of each of the plurality of inverters is coupled to an output end of an inverter of the previous stage, an inverter of the first end among the plurality of inverters receives the first input signal, and an inverter of the last end among the plurality of inverters outputs the second input signal.

The gate driving circuit further includes: a first current source supplying a first current; a first slope control switch being switched according to the first control signal; a second slope control switch being switched according to the second control signal; a second current source of which a first end is coupled to the first slope control switch and supplying a second current; a third current source of which a first end is coupled to the second slope control switch and supplying a third current; and a transistor including a first electrode electrically coupled to a gate of the power switch, a gate to which a gate control signal corresponding to a pulse width control signal that controls switching operation of the power switch is input, a second electrode coupled to a second end of the first slope control switch and a second end of the second slope control switch.

The gate driving circuit further includes a first resistor coupled between the second electrode of the transistor and the gate of the power switch.

The gate driving circuit further includes a second resistor coupled in series with the first resistor and a third slope control switch coupled in parallel with the second resistor, and the third slope control switch is turned on when at least one of the first control signal and the second control signal is an enable signal.

The gate driving circuit further includes a negative slope control circuit that controls a falling slope of the gate voltage at a third time after a third delay period is passed from a falling time of the gate voltage.

The negative slope control circuit includes: a fourth current source supplying a fourth current; a first transistor including a first electrode electrically coupled to a gate of the power switch, the power switch, a gate to which a gate control signal corresponding to a pulse width control signal that controls switching operation of the power switch is input, and a first transistor including a second electrode coupled to the fourth current source; a second transistor including a gate to which the gate control signal is input; and a diode string coupled between a first electrode of the second transistor and the gate of the power switch.

The number of diodes included in the diode string is determined according to a threshold voltage, and the threshold voltage determines a fluctuation time of a falling slope of the gate voltage.

A switch control circuit according an embodiment includes: a power switch; and a gate driving circuit generating a gate voltage supplied to a gate of the power switch, fluctuating a rising slope of the gate voltage at a first time after a first delay period is passed from a rising time of the gate voltage, and fluctuating the rising slope of the gate voltage at a second time after a second delay period is passed from the first time. The first delay period varies according to a temperature.

The gate driving circuit controls a first level of a source current supplied to a gate of the power switch during the first delay period and a second level of the source current during the second delay period to be different from each other.

The gate driving circuit controls a third level of the third current to be different from the second level from a time after the first delay period and the second delay period are passed.

The gate driving circuit controls a falling slope of the gate voltage at a third time after a third delay period is passed from a falling time of the gate voltage.

A falling slope of the gate voltage is changed after the third time by variation of an input capacitance of an MOSFET that forms the power switch.

The rising slope of the gate voltage is changed between from the first time to a time after the second delay period is passed by variation of the input capacitance of the MOSFET that forms the power switch.

A power supply according to an embodiment includes: a power switch; a transformer including a primary side wire coupled to the power switch and a secondary side wire coupled to an output end; and a switch control circuit receiving an output voltage of the output end, generating a pulse width control signal that controls switching operation of the power switch using a sense voltage that sensed a drain current flowing to the power switch, generating a gate voltage according to the pulse width control signal, fluctuating a rising slope of the gate voltage at a first time after a first delay period is passed from a rising time of the gate voltage, and fluctuating the rising slope of the gate voltage at a second time after a second delay period is passed from the first time.

The switch control circuit compensates fluctuation of a threshold voltage by changing the first delay period according to a temperature.

The switch control circuit controls a falling slope of the gate voltage at a third time after a third delay period is passed from a falling time of the gate voltage.

According to the embodiments, a gate driving circuit that can reduce EMI, a switching loss, and a conduction loss, a switch control circuit including the gate driving circuit, and a power supply can be provided.

DETAILED DESCRIPTION OF THE EMBODIMENTS

Figure 1:
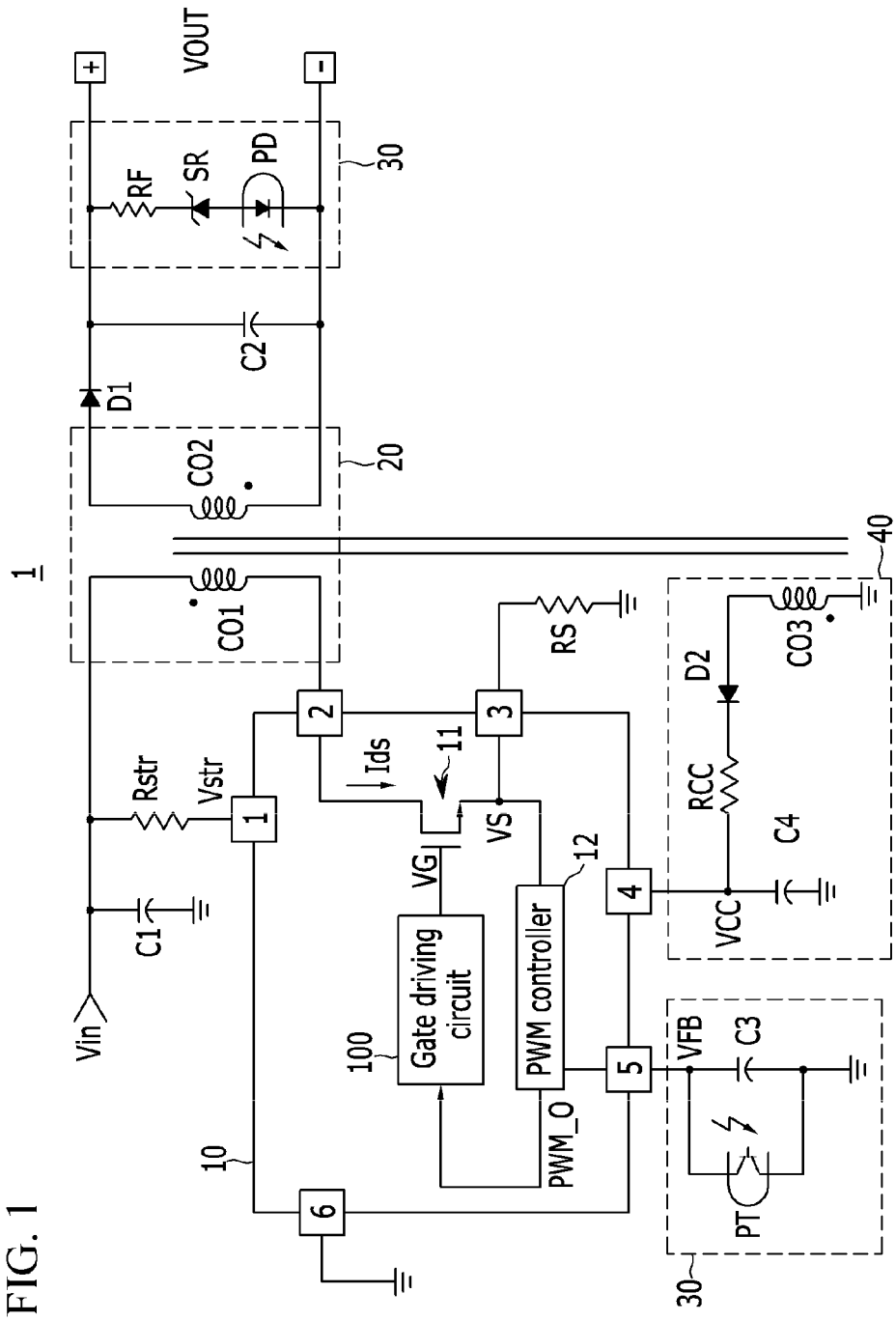
FIG. 1 shows a power supply according to an embodiment.

In the following detailed description, only certain embodiments have been shown and described, simply by way of illustration. As those skilled in the art would realize, the described embodiments may be modified in various different ways, all without departing from the spirit or scope of the invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Hereinafter, a gate driving circuit and a power supply including the gate driving circuit according to an embodiment will be described with reference to the accompanying drawings.

FIG. 1 shows a power supply according to an embodiment.

In FIG. 1, a power supply 1 is realized as a flyback converter, but the embodiment is not limited thereto.

A primary side of the power supply 1 to which an input voltage Vin is input and a secondary side of the power supply 1 connected with output terminals (+ and −) are insulated from each other. A voltage between the output terminal (+) and the output terminal (−) is referred to as an output voltage VOUT. FIG. 1 illustrates that the primary side and the secondary side are insulated from each other, but the embodiment is not limited thereto. The primary side and the secondary side of the power supply 1 to which a gate driving circuit according to the embodiment may not be insulated from each other.

The power supply 1 includes a switch control circuit 10, a transformer 20, a feedback circuit 30, and a power supplying circuit 40.

A smoothing capacitor C1 includes a first electrode connected to the input voltage Vin, and smoothens the input voltage Vin. A start resistor Rstr is connected between the input voltage Vin and the number 1 pin of the switch control circuit 10.

The switch control circuit 10 includes number 1 to number 6 pins. The number 1 pin is supplied with a start voltage Vstr through the start resistor Rstr. The start voltage Vstr may be used to generate a power voltage for operation of the switch control circuit 10 when activating the power supply 1.

The number 2 pin is connected to a first end of the primary wire CO1 and a drain of the power switch 11. The number 3 pin is connected to a sense resistor RS and a source of the power switch 11. The number 4 pin is connected to the power supplying circuit 40, and a power voltage VCC is supplied to the switch control circuit 10 through the number 4 pin. The number 5 pin is connected to the feedback circuit 30, and a feedback voltage VFB is connected to the number 5 pin. The number 6 pin is connected to a primary side ground.

The switch control circuit 10 includes the power switch 11, a PWM controller 12, and a gate driving circuit 100.

The power switch 11 includes a drain connected to a first end of the primary side wire CO1, a gate to which a gate voltage VG is input, and a source connected to a first end of the sense resistor RS through the number 3 pin. The power switch 11 is an n channel transistor, and is turned on by a high-level gate voltage VG and turned off by a low-level gate voltage VG.

When the power switch 11 is turned on, a current flowing to the primary side wire CO1 is increased according to the input voltage Vin. During the turn-on period of the power switch 11, energy is stored in the primary side wire CO1. In this case, a drain current Ids flowing to the power switch 11 is also increased. A sense voltage VS generated by the drain current Ids flowing to the sense resistor RS is input to the PWM controller 12.

The PWM controller 12 receives the feedback voltage VFB and the sense voltage VS and generates a pulse width control signal PWM_OUT. The pulse width control signal PWM_OUT is a signal controlling a switching operation of the power switch 11.

For example, the PWM controller 12 increases the pulse width control signal PWM_OUT to high level (rising edge) according to a clock signal that determines a switching frequency and decreases the pulse witch control signal PWM_OUT to low level (falling edge) at a time that the sense voltage VS reaches the feedback voltage VFB.

The gate driving circuit 100 controls a rising slope and a falling slope of the gate voltage VG to prevent generation of EMI due to the switching operation of the power switch 11. In this case, the gate driving circuit 100 controls the rising slope of the gate voltage VG in consideration of variation of a threshold voltage of the power switch 11 according to a temperature. This will be described later with reference to FIG. 2 to FIG. 7. The gate driving circuit 100 is synchronized at the rising edge of the pulse width control signal PWM_OUT and thus increases the gate voltage VG, and synchronized at the falling edge and thus decreases the gate voltage VG.

The secondary side wire CO2 of the transformer 20 is connected with a rectification diode D1 and an output capacitor C2. During the turn-off period of the power switch 11, the rectification diode D1 is connected and thus a current flowing to the secondary side wire CO2 is rectified through the rectification diode D1 such that the output capacitor C2 is charged. The output capacitor C2 is connected between the output terminal (+) and the output terminal (−) and maintains the output voltage VOUT with a DC voltage.

The feedback circuit 30 uses an opto-coupler to sense the output voltage VOUT. The opto-coupler is formed of a phototransistor PT and a photodiode PD. The feedback circuit 30 includes a resistor RF, a shunt regulator SR, the photodiode PD, the photo transistor PT, and a capacitor C3.

The resistor RF, the shunt regulator SR, and the photodiode PD are connected in series, and the phototransistor PT and the capacitor C3 are connected in parallel with each other. The shunt regulator SR is turned on by the output voltage VOUT, and a current according to the output voltage VOUT flows to the shunt regulator SR. The photodiode PD emits light according to the current passed through the shunt regulator SR, and a current that depends on the light amount of the photodiode PD flows to the phototransistor PT. The feedback voltage VFB generated in the capacitor C3 is controlled by the current flowing to the phototransistor PT.

For example, when the output voltage VOUT is increased and thus the current flowing to the phototransistor PT is increased, the capacitor C3 is discharged. Then, the feedback voltage VFB is decreased and the turn-on time of the power switch 11 is decreased. Then, energy stored in the primary side wire CO1 is decreased and thus energy transmitted to the secondary side wire CO2 is decreased. Accordingly, the output voltage VOUT is decreased. With such a negative feedback method, the output voltage VOUT can be constantly controlled.

The power supplying circuit 40 rectifies a current generated in an auxiliary wire CO3 and charges a capacitor C4 by using the rectified current to generate the power voltage VGG. The power supplying circuit 40 includes the auxiliary wire CO3, a rectification diode D2, a resistor RCC, and the capacitor C4.

A first end of the auxiliary wire CO3 is connected to an anode of the rectification diode D2, a cathode of the rectification diode D2 is connected to a first end of the resistor RCC, and a second end of the resistor RCC is connected to a first electrode of the capacitor C4. The power voltage VCC is a voltage charged in the capacitor C4.

During the turn-off period of the power switch 11, the rectification diode D2 is turned on. A current is supplied to the capacitor C4 through the rectification diode D2 and the capacitor C4 is charged such that the power voltage VCC is generated.

Hereinafter, the gate driving circuit 100 will be described with reference to FIG. 2.

Figure 2:
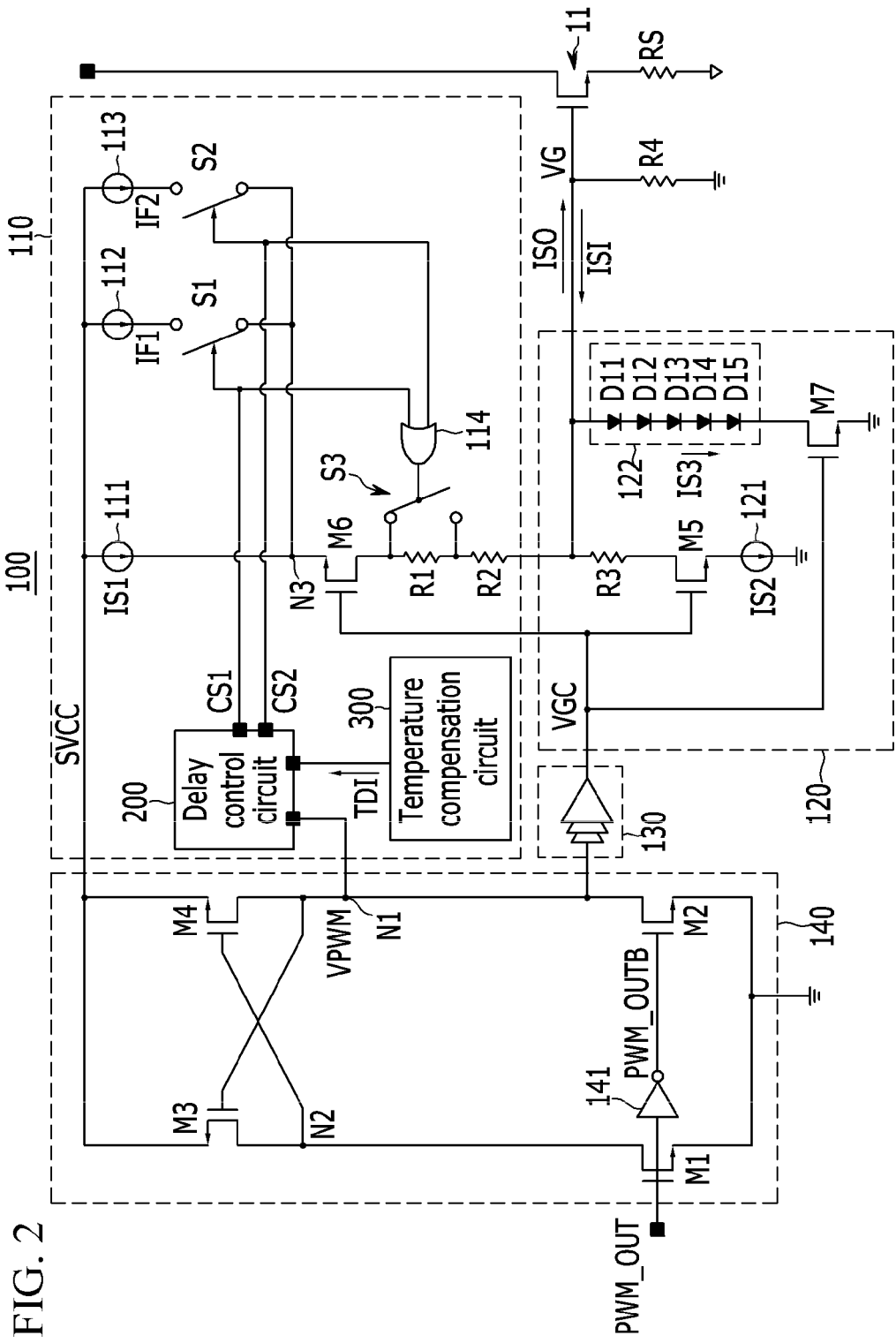
FIG. 2 shows a gate driving circuit according to the embodiment.

FIG. 2 shows the gate driving circuit according to the embodiment.

As shown in FIG. 2, the gate driving circuit 100 includes a positive slope control circuit 110, a negative slope control circuit 120, a fan-out circuit 130, a level shifter 140, and a resistor R4.

The pulse width control signal PWM_OUT is input to an input terminal of the gate driving circuit 100, an output terminal of the gate driving circuit 100 is connected to the gate of the power switch 1, and the gate voltage VG is a voltage of the output terminal of the gate driving circuit 100.

The level shifter 140 receives the pulse width control signal PWM_OUT, and generates a pulse width voltage VPWM by level-shifting the pulse width control signal PWM_OUT to a voltage level that is appropriate for the gate driving circuit 100. The level shifter 140 includes two CMOSFETs.

For example, the level shifter 140 includes one CMOSFET formed of an NMOSFET M1 and a PMOSFET M3 and the other CMOSFET formed of an NMOSFET M2 and a PMOSFET M4. The level shifter 140 further includes an inverter 141.

The pulse width control signal PWM_OUT is input to a gate of the NMOSFET M1. The inverter 141 generates an inverse pulse width control signal PWM_OUTB by inverting the pulse width control signal PWM_OUT, and the inverse pulse width control signal PWM_OUTB is input to a gate of the NMOSFET M2. Sources of the two PMOSFETs M3 and M4 are connected with a voltage SVCC, a gate of the PMOSFET M3 is connected to an output node N1 of the level shifter 140, and a gate of the PMOSFET M4 is connected to a node N2. A drain of the NMOSFET M1 and a drain of the PMOSFET M3 are connected to a node N2, and a drain of the NMOSFET M2 is connected to the output node N1. Sources of the NMOSFETs M1 and M2 are connected to the primary side ground.

When the pulse width control signal PWM_OUT is high level, the NMOSFET M1 is turned on, and when a voltage of the node N2 becomes a ground level, the PMOSFET M4 is turned on. Then, the output node N1 is connected to the voltage SVCC. The voltage SVCC is high level. In this case, the inverse pulse width control signal PWM_OUTB is low level, and therefore the NMOSFET M2 is in the turn-off state, and since the voltage of the output node N1 is high level, the PMOSFET M3 is also in the turn-off state.

When the pulse width control signal PWM_OUT is low level, the inverse pulse width control signal PWM_OUTB is high level, and therefore the NMOSFET M2 is turned on and the voltage of the output node N1 becomes the ground level. Since the voltage of the output node N1 is the ground level, the PMOSFET M3 is turned on and the node N2 is connected to the voltage SVCC. In this case, the NMOSFET M1 and the PMOSFET M4 are in the turn-off state.

As described, the level shifter 140 generates a pulse width voltage VPWM of the SVCC voltage level when the pulse width control signal PWM_OUT is high level, and generates a pulse width voltage VPWM of the ground level when the pulse width control signal PWM_OUT is low level.

The positive slope control circuit 110 is synchronized by the pulse width voltage VPWM and increases the gate voltage VG. The positive slope control circuit 110 controls at least two delay periods that control a rising slope of the gate voltage VG according to a temperature variation, and controls the rising slope of the gate voltage VG according to the at least two delay periods. A threshold voltage of the power switch 11 is changed according to the temperature variation, and the positive slope control circuit 110 changes at least two delay periods according to a temperature so as to compensate the change of the threshold voltage.

The positive slope control circuit 110 includes three current sources 111 to 113, three slope control switches S1, S2, and S3, two resistors R1 and R2, an OR gate 114, a transistor M6, a delay control circuit 200, and a temperature compensation circuit 300.

The temperature compensation circuit 300 generates a temperature detection signal TDI that is changed according to a temperature. For example, the temperature compensation circuit 300 may generate a current that changes according to a temperature as a temperature detection signal TDI.

The delay control circuit 200 controls a first delay period among the at least two delay periods according to the temperature detection signal TDI. The other delay period among the at least two delay periods is set to a period acquired by adding a predetermined delay period to the first delay period, and accordingly, when the first delay period is changed, the other delay period is also changed.

The resistor R4 is connected between the gate of the power switch 11 and the ground, and a current may flow to the resistor R4 when pull-down of the gate voltage occurs.

The temperature compensation circuit 300 and the delay control circuit 200 according to the embodiment will be exemplarily described with reference to FIG. 3 and FIG. 4. For convenience of description, the number of at least two delay periods is set to two.

Figure 3:
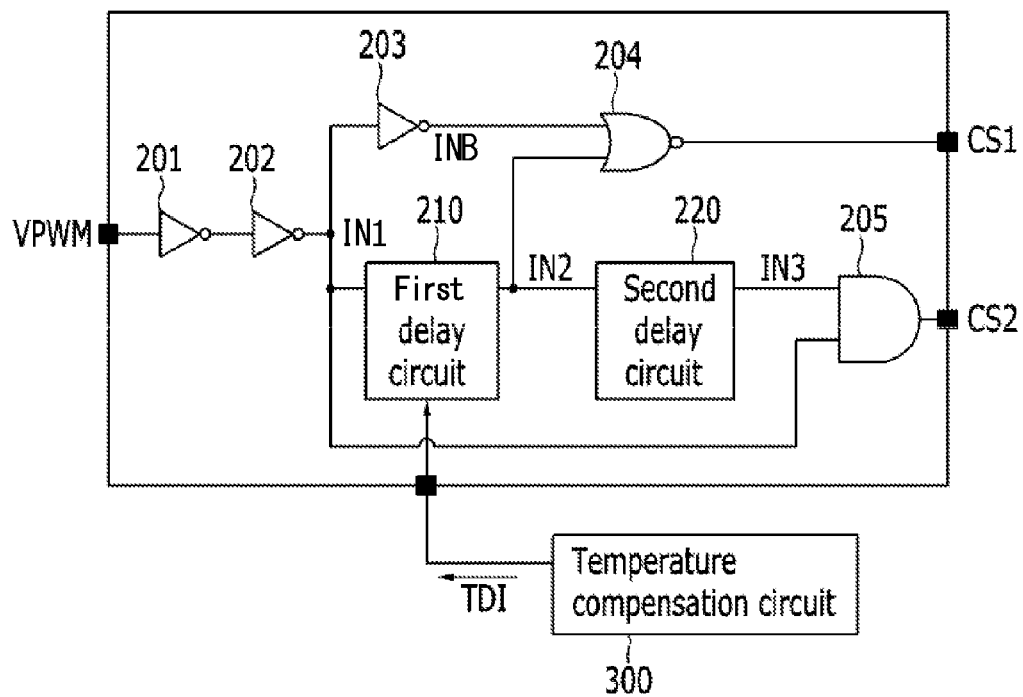
FIG. 3 shows a delay control circuit according to the embodiment.

FIG. 3 shows the delay control circuit according to the embodiment.

Figure 4:
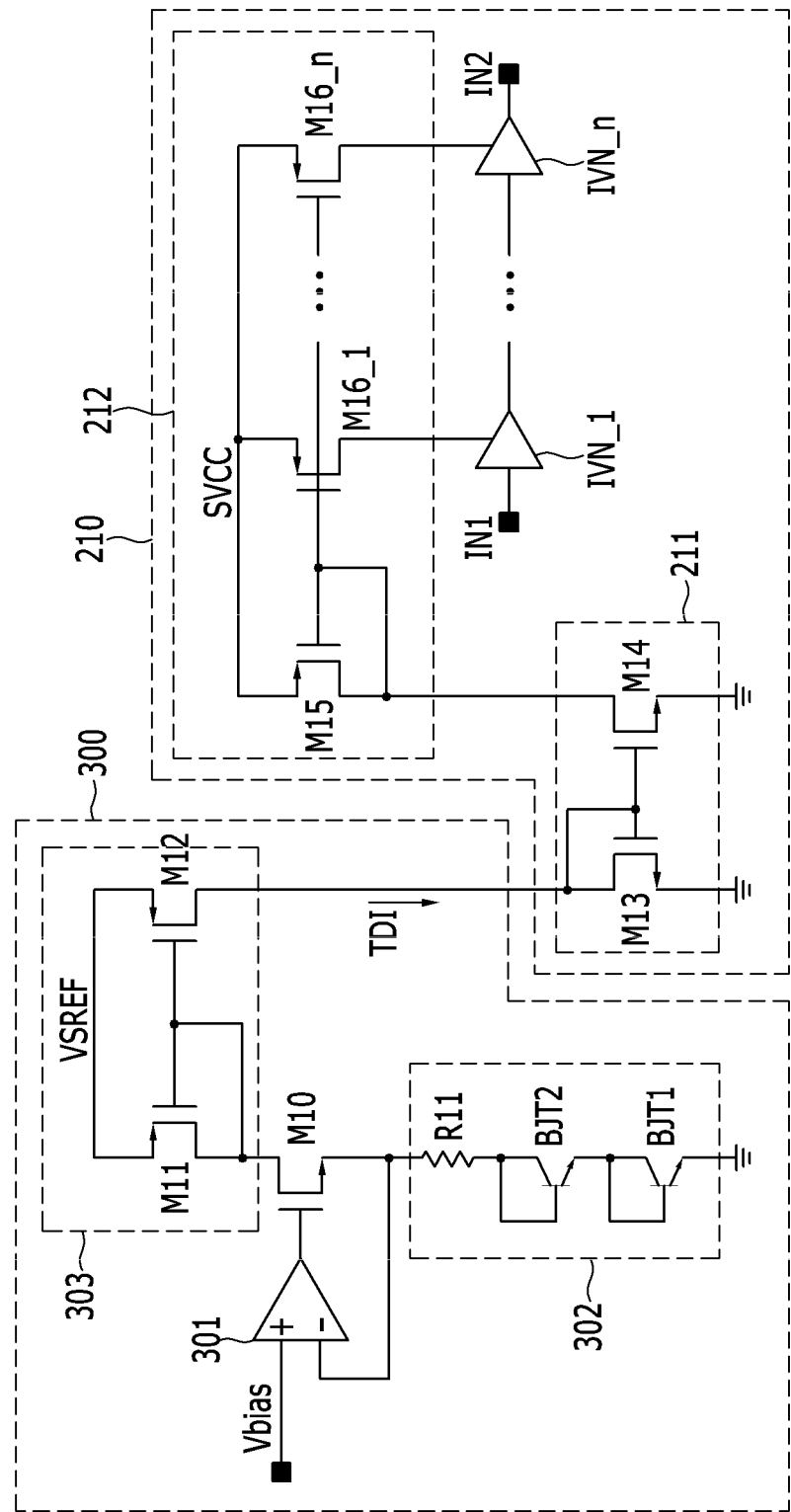
FIG. 4 shows a temperature compensation circuit according to the embodiment.

FIG. 4 shows the temperature compensation circuit according to the embodiment.

FIG. 4 illustrates the temperature compensation circuit 300 and the first delay circuit 210 of the delay control circuit 200.

The temperature compensation circuit 300 shown in FIG. 4 includes an operation amplifier 301, two transistors M11 and M12 forming a current mirror circuit 303, a transistor M10, and a variable resistor 302.

The variable resistor 302 has a structure in which resistance is changed according to a temperature, and for example, the variable resistor 302 includes a resistor R11 and two BJT1 and BJT2 of which bases and emitters are diode-connected. The resistor R11, the BJT1, and the BJT2 are connected in series.

The resistor R11 has a positive characteristic with respect to a temperature variation, and on-resistance of the diode-connected BJT1 and BJT2 have negative characteristics with respect to the temperature variation. FIG. 4 exemplarily illustrates the configuration of the variable resistor 302, and the embodiment is not limited thereto. A resistance value of the variable resistor 302 is set to be decreased according to a temperature increase.

A bias voltage Vbias is input to a non-inverse terminal (+) of the operation amplifier 301, and amplifies a difference between an inverse terminal (−) and the bias voltage Vbias and outputs the amplified output. The inverse terminal (−) of the operation amplifier 301 is connected to the variable resistor 302 and a source of the transistor M10. An output terminal of the operation amplifier 301 is connected to a gate of the transistor M10, and a drain of the transistor M10 is connected to a drain of the transistor M11. A current flowing to the transistor M11 is controlled according to an output of the operation amplifier 301 so that a voltage of the inverse terminal (−) is maintained with the bias voltage Vbias.

A gate and the drain of the transistor M11 are diode-connected, and a source of the transistor M11 and a source of the transistor M12 are supplied with a reference voltage VSREF. A gate of the transistor M12 is connected to the gate of the transistor M11, and a current is output through the drain of the transistor M12 as the temperature detection signal TDI.

When a value of the variable resistance 320 is decreased according to the temperature increase, a voltage of the non-inverse terminal (−) is decreased and thus the output of the operation amplifier 301 is increased. Then, a current flowing through the transistor M10 is increased, and the current flowing to the transistor M10 is mirrored by a current mirror circuit 303 and thus flows through the transistor M12. On the contrary, when the value of the variable resistor 302 is increased according to a temperature decrease, the voltage of the non-inverse terminal (−) is increased and thus the output of the operation amplifier 301 is decreased. Then, the current flowing through the transistor M10 is decreased, and the current flowing to the transistor M10 is mirrored by the current mirror circuit 303 and thus flows to the transistor M12. The current that varies according to the temperature change with such a process is the temperature detection signal TDI.

As shown in FIG. 3, the delay control circuit 200 includes three inverters 201 to 203, an NOR gate 204, an AND gate 205, a first delay circuit 210, and a second delay circuit 220. The first delay circuit 210 controls the first delay period according to the temperature detection signal TDI transmitted from the temperature compensation circuit 300.

In further detail, as shown in FIG. 4, the first delay circuit 210 includes two current mirror circuits 211 and 212 and a plurality of inverters INV_1 to INV_n. For example, the number of the plurality of inverters INV_1 to INV_n is n.

The current mirror circuit 211 mirrors the temperature detection signal TDI and transmits the mirrored signal to the current mirror circuit 212. The current mirror circuit 212 mirrors the received current and supplies a driving current to each of the plurality of inverters INV_1 to INV_n.

The current mirror circuit 211 includes two transistors M13 and M14. A drain and a gate of the transistor M13 are connected to each other, the temperature detection signal TDI is input through the drain, and a source of the transistor M13 is connected to the ground. A gate of the transistor M14 is connected to the gate of the transistor M13, a source of the transistor M14 is connected to the ground, and a drain of the transistor M14 is connected to a drain of the transistor M15 of the current mirror circuit 212.

When the temperature detection signal TDI flows to the transistor M13, the temperature detection signal TDI is mirrored by the current mirror circuit 211 and the mirrored current flows to the transistor M14. Then, the current mirrored by the current mirror circuit 211 flows to the transistor 15.

The current mirror circuit 212 includes a transistor M15 and n transistors M16_1 to M16_n.

A drain and a gate of the transistor M15 are connected to each other, and a source is connected to the voltage SVCC. A source of each of the n transistors M16_1 to M16_n is connected to the voltage SVCC, a gate of each of the n transistors M16_1 to M16_n is connected to the gate of the transistor M14, and a source of each of the n transistors M16_1 to M16_n is connected to the corresponding inverter among the n inverters INV_1 to INV_n.

A current flowing to each of the n transistors M16_1 to M16_n supplies a driving current to the corresponding inverter. An input terminal of each of (n−1) inverters INV_2-INV_n is connected to an output terminal of the previous inverter, and inverts an output of the previous inverter and outputs the inverted output. A first input signal IN1 is input to the inverter INV_1, and the inverter INV_n outputs a second input signal IN2.

Each of the n inverters INV_1-INV_n inverts an input of an input terminal thereof and outputs the inverted input for a predetermined period (hereinafter, referred to as an output delay). In further detail, an output delay of each of the n inverters INV_1 to INV_n may be determined by a driving current supplied to the corresponding inverter and a capacitor connected to an output terminal of the corresponding inverter. The capacitor may be a parasitic capacitor, or although it is not illustrated in FIG. 4, a separate capacitor may be connected between an output terminal of each inverter and the ground. Instead of the inverter, a delay generation means that can control an output delay using a supplied driving current and a capacitor may be used.

For example, when the n transistors M16_1 to M16_n are the same transistors, the same driving current is supplied to each of the n inverters INV_1 to INV_n. In addition, when the parasitic capacitors connected to the output terminals of the n transistors INV_1 to INV_n have the same capacitance, the n inverters INV_1 to INV_n respectively have the same output delay. Since the temperature detection signal TDI mirrored through the current mirror circuits 211 and 212 is supplied as the driving current to each of the n transistors INV_1 to INV_n, the temperature detection signal TDI determines the output delay of each of the n inverters INV_1 to INV_n.

Therefore, the first delay period of the first delay circuit 210 is changed according to the temperature variation, and the first delay circuit 210 outputs the second input signal IN2 by delaying the first input signal IN1 by the first delay period.

Referring back to FIG. 3, the pulse width voltage VPWM is input to an input terminal of the inverter 201, an output terminal of the inverter 201 is connected to an input terminal of the inverter 202, and an output terminal of the inverter 202 is connected to an input terminal of the inverter 203, the first delay circuit 210, and an input terminal of the AND gate 205.

Thus, the pulse width voltage VPWM becomes the first input signal IN1 through the inverter 201 and the inverter 202, and the third inverter 203 outputs an inverse signal INB by inverting the first input signal IN1. As previously described, the first delay circuit 210 outputs the second input signal IN2 by delaying the first input signal IN1 by the first delay period.

The NOR gate 204 generates a first logic signal CS1 by performing a logic operation on the inverse input signal INB and the second input signal IN2. The NOR gate 204 generates a high-level (i.e., enable level) first control signal CS1 when the two inputs are low level, and generates a low-level first control signal CS1 when at least one of the two inputs is high level.

The second delay circuit 220 outputs a third input signal IN3 by delaying the second input signal IN2 by a second delay period.

The AND gate 205 generates a second control signal CS2 by performing an AND operation on the first input signal IN1 and the third input signal IN3.

Figure 5:
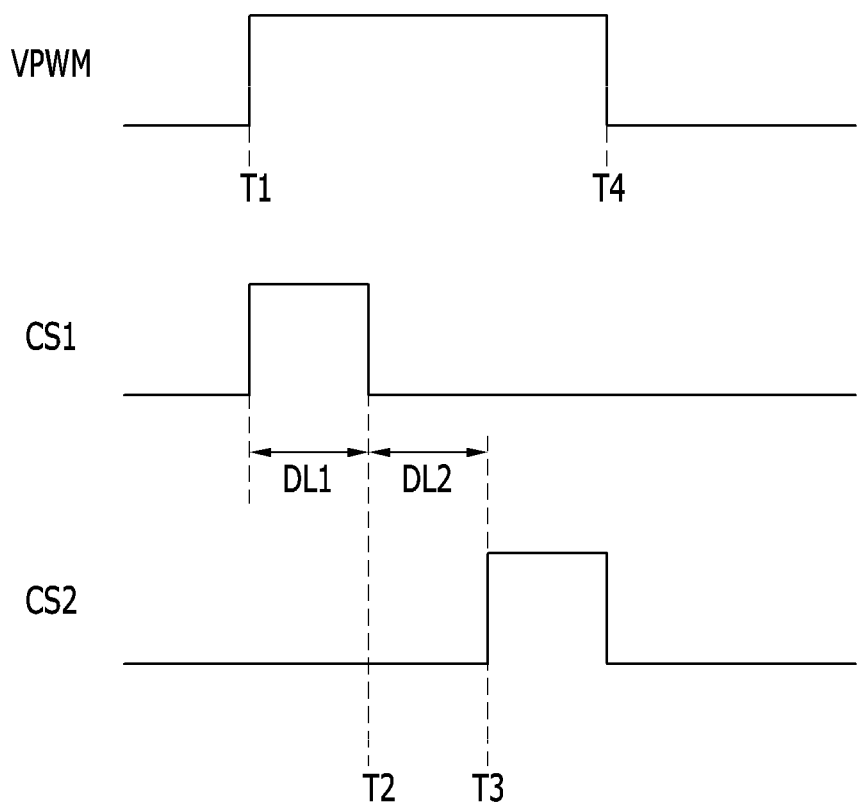
FIG. 5 shows a pulse width voltage, a first control signal, and a second control signal according to the embodiment.

FIG. 5 shows the pulse width voltage, the first control signal, and the second control signal according to the embodiment.

As shown in FIG. 5, the pulse width voltage VPWM is increased to high level at T1, and the third input signal IN3 becomes high level at T3 after the first delay period DL1 and the second delay period DL2 are passed from the time that the first input signal IN1 is synchronized at T1 and thus becomes high level. That is, the second control signal CS2 becomes high level (i.e., enable level) at T3 after the first delay period DL1 and the second delay period DL2 are passed from the rising edge time T1 at which that pulse width voltage VPWM is increased to high level.

Since the second input signal IN2 is low level at the rising edge time T1 of the pulse width voltage VPWM, two inputs of the NOR gate 204 become low level and thus the first control signal CS1 is increased to high level. In addition, the second input signal IN2 becomes high level at T2 after the first delay period DL1 is passed from the rising edge time T1 of the pulse width voltage VPWM, and the first control signal CS1 becomes low level. The first control signal CS1 is high level during a period T1 to T2, that is, a period from the rising edge time T1 of the pulse width voltage VPWM to the time T2 after the first delay period DL1 is passed.

The first input signal IN1 becomes low level at a falling edge time T4 at which that the pulse width voltage VPWM is decreased to low level, and the AND gate 205 generates a low-level second control signal CS2.

Referring back to FIG. 2, a fan-out circuit 130 receives the pulse width voltage VPWM, and generates a gate control signal VGC by inverting the pulse width voltage VPWM in stages. For example, the fan-out circuit 130 generates a low-level gate control signal VGC when the pulse width voltage VPWM is high level, and generates a high-level gate control signal VGC when the pulse width voltage VPWM is low level. The gate control signal VGC is input to the positive slope control circuit 110 and the negative slope control circuit 120.

That is, the gate control signal VGC is input to a gate of the transistor M6 of the positive slope control circuit 110 and a gate of the transistor M5 of the negative slope control circuit 120. When the gate control signal VGC is high level, the transistor M5 is turned on, and when the gate control signal VGC is low level, the transistor M6 is turned on.

A source of the transistor M6 is connected to a node N3, a drain of the transistor M6 is connected to a first end of the resistor R1, and a second end of the resistor R1 and a first end of the resistor R2 are connected to each other. A second end of the resistor R2 is connected to the gate of the power switch 11.

In the positive slope control circuit 110, a first current source 111 supplies a current IS1, a second current source 112 supplies a current IF1, and a third current source 113 supplies a current IF2. A source current ISO supplied to the gate of the power switch 11 from the positive slope control circuit 110 includes the current IS1, and further includes one of the current IF1 and the current IF2 according to the first and second control signals CS1 and CS2.

The first switch S1 is connected between the second current source 112 and the node N3, and performs switching operation by the first control signal CS1. For example, the first switch S1 is turned on by a high-level first control signal CS1. The second switch S2 is connected between the third current source 113 and the node N3, and performs switching operation by the second control signal CS2. For example, the second switch S2 is turned on by a high-level second control signal CS2.

The OR gate 114 receives the first control signal CS1 and the second control signal CS2, and controls the third switch S3 to perform switching operation according to a result of an OR operation formed on the two input signals. The third switch S3 is connected in parallel with the resistor R1.

The OR gate 114 outputs a high-level output when at least one of the two input signals is high level and outputs a low-level output when the two input signals are low level. The third switch S3 is turned on by the high-level output. Then, at least one of the first control signal CS1 and the second control signal CS2 is high level, the third switch S3 is turned on, and when both of the first control signal CS1 and the second control signal CS2 are low level, the third switch S3 is turned off.

Hereinafter, operation of the positive slope control circuit 110 will be described with reference to FIG. 6.

Figure 6:
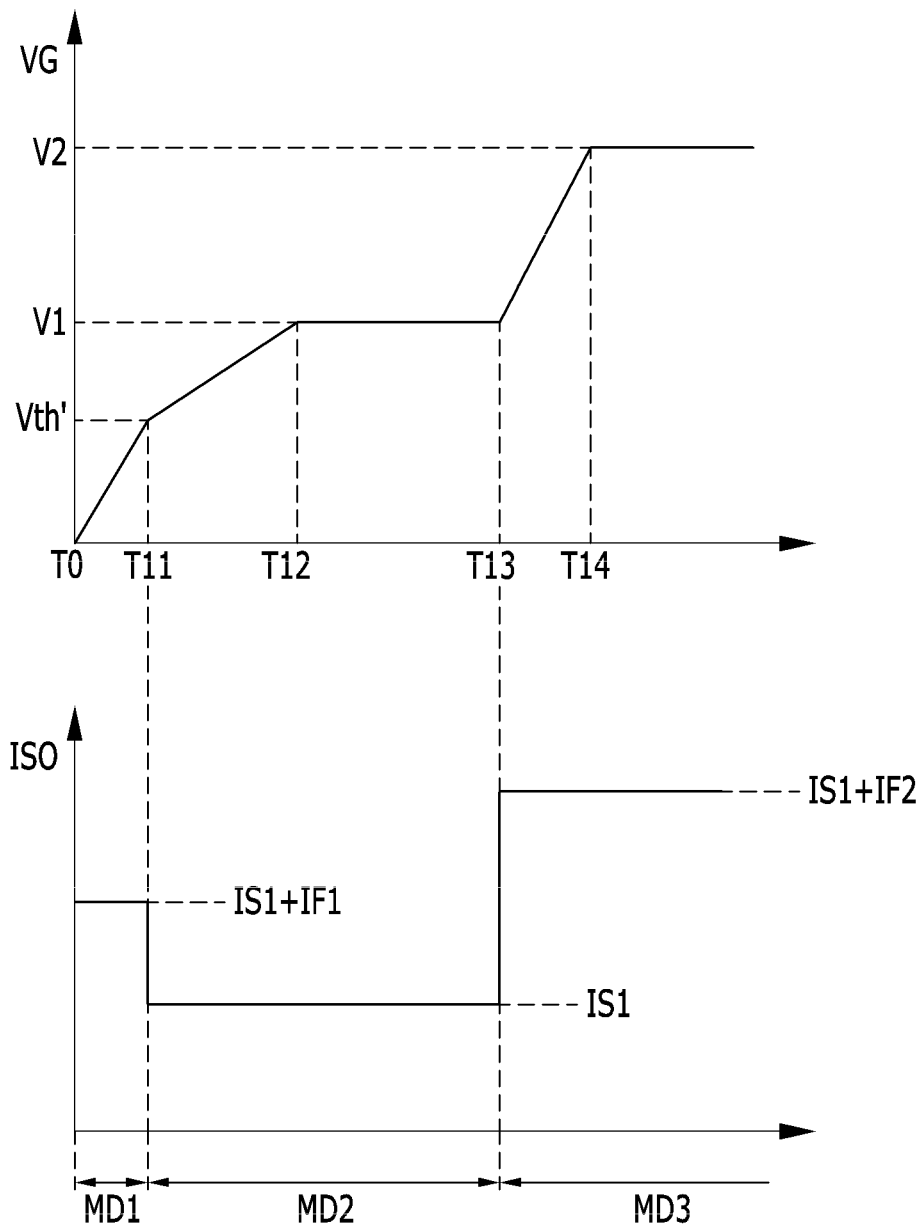
FIG. 6 shows a gate voltage and a source current according to the embodiment.

FIG. 6 shows the gate voltage and the source current according to the embodiment.

Hereinafter, the gate voltage VG shown in FIG. 6 is determined according to the source current ISO and input capacitance of the MOSFET that forms the power switch 11. The input capacitance is the sum of capacitance of a parasitic capacitor (not shown) between a gate and a drain of the MOSFET and capacitance of a parasitic capacitor (not shown) between the gate and a source of the MOSFET. The input capacitance is changed according to an operation area of the MOSFET.

At T0, the gate control signal VGC becomes low level and thus the transistor M6 is turned on. The pulse width voltage VPWM and the gate control signal VGC are synchronized with each other. That is, the rising time T1 of the pulse width voltage VPWM and the T0 at which the gate control signal VGC becomes low level are substantially the same time point.

Thus, at the T0, the first control signal CS1 is increased to high level and the first and third switches S1 and S3 are turned on. From the T0, the source current ISO is the sum of the current IS1 and the current IF1. Since the third switch S3 is turned on, the source current ISO flows to the power switch M11 through the third switch S3 and the resistor R2 rather than flowing via the resistor R1, and the gate voltage VG is increased. Hereinafter, a mode in which the source current ISO equals IS1+IF1 is called a first mode MD1.

A period of the first mode MD1 is a high-level period of the first control signal CS1, that is, the first delay period DL1. During the period of the first mode MD1, the gate voltage VG may exceed a threshold voltage Vth of the power switch 11. As previously described, the first delay period DL1 is set to compensate a variation of the threshold voltage according to a temperature, and therefore, the gate voltage VG may reach at least the threshold voltage Vth during the period of the first mode MD1.

For convenience of description, in FIG. 6, the gate voltage VG reaches a reference threshold voltage Vth' acquired by adding a predetermined margin to the threshold voltage Vth at T11 and the first mode MD1 is also terminated at T11. However, the embodiment is not limited thereto, and the first delay period DL1 is set to be longer than a period (e.g., T0 to T11) during which the gate voltage VG reaches the reference threshold voltage Vth' by designing the temperature compensation circuit 300 and the delay control circuit 200. That is, the first delay period DL1 may be set to a period including at least the period T0 to T11.

When the first mode MD1 is terminated (i.e., after the first delay period DL1 is passed), the first control signal CS1 becomes low level. Then, the first switch S1 and the third switch S3 are turned off. Then, the source current ISO is a current IS1 and is supplied to the gate of the power switch 11 through the resistor R1 and the resistor R2. Resistance is increased in the path of the source current ISO so that an increasing slope of the gate voltage VG is decreased compared to the first mode MD1. Hereinafter, a mode during which the source current ISO is IS1 is called a second mode MD2.

A parasitic capacitor between the gate and the drain is influenced by a voltage between the gate and the drain. For example, when the parasitic capacitor between the gate and the drain is increased due to a miller effect, and the increasing parasitic capacitor is called a miller capacitor.

Then, the increasing gate voltage VG is maintained with a constant level from T12 at which the gate voltage VG reaches the voltage V1. An input capacitance is increased by the miller capacitor and thus the gate voltage VG is no longer increased by the source current ISO and then maintained with a constant level.

Referring to the first control signal CS1 and the second control signal CS2 shown in FIG. 5, the duration of the second mode MD2 is determined according to the second delay period DL2. The second delay period DL2 may be properly set to enable soft increase of the gate voltage VG. For example, the second delay period DL2 may be set to a period that includes a period during which the gate voltage VG reaches the voltage V1 and a predetermined margin (in FIG. 6, a period T12 to T13).

At T13, the second mode MD2 is terminated (i.e., the second delay period DL2 is passed), and the second control signal CS2 becomes high level. Then, the second switch S2 and the third switch S3 are turned on. Thus, the source current ISO becomes the sum of the current IS1 and the current IF2. Since the third switch S3 is turned on, the source current ISO flows to the gate of the power switch 11 through the third switch S3 and the resistor R2 without passing through the resistor R1, and the gate voltage VG is increased. Hereinafter, a mode during which the source current ISO is IS1+IF2 is called a third mode MD3.

In the third mode MD3, when the gate voltage VG reaches a voltage V2 that is determined by the source current ISO and an input capacitance of the power switch 11, the gate voltage VG is no longer increased and maintained with the voltage V2. As shown in FIG. 6, the gate voltage VG reaches the voltage V2 at T14 and then maintained with a constant level from T14.

As described, as shown in FIG. 6, a rising waveform of the gate voltage VG is controlled to be soft by the first delay period DL1 and the second delay period DL2. Then, a drain current Ids flowing to the power switch 11 has a low variation rate according to time in a region where the EMI is generated. Thus, generation of EMIT due to hard switching at turn-on of a power switch 11 in a conventional case can be prevented.

The EMI is generally generated in a period (e.g., T11 to T13 in FIG. 6) during which the drain voltage of the power switch 11 is decreased to zero voltage from the turn-on time of the power switch 11, and when the gate voltage VG is gradually increased during the period, the rising slope of the drain current Ids is decreased and thus generation of the EMI due to hard switching is suppressed.

In addition, the rising slope of the gate voltage VG is increased during a period that is not relevant to the generation of the EMI so as to decrease a switching loss or a conductive loss. For example, a period during which the gate voltage VG is increased to the threshold voltage Vth (i.e., T0 to T11 in FIG. 6) is a period during which the switching loss is occurred, and a period after a time at which the drain voltage is decreased to zero voltage (i.e., a period after T13 in FIG. 6) is a period during which only the conductive loss is occurred. During these periods, the rising slope of the gate voltage VG is steeper than other periods (i.e., T11 to T13 in FIG. 6). Then, the period during which the conductive loss and the switching loss are occurred is decreased, thereby improving power consumption.

In FIG. 6, T13 may be set to a time at which the drain voltage of the power switch 11 reaches zero voltage. Alternatively, T13 may be set to a time delayed for a predetermined time period from the time at which the drain voltage reaches zero voltage.

In FIG. 6, the embodiment includes the first to third modes according to a level of the source current ISO, but the embodiment is not limited thereto. The first to third modes are controlled according to the first delay period DL1 and the second delay period DL2. In the same way, the source current ISO may be controlled with four or more modes when three or more delay periods are controlled by the delay control circuit 200. In addition, the current IF2 is higher than the current IF1 in FIG. 6, but the embodiment is not limited thereto. The current IF2 may be lower than the current IF1 or the two currents may equal to each other according to design.

Referring back to FIG. 2, the negative slope control circuit 120 will be described in detail.

The negative slope control circuit 120 includes a fourth current source 121, a transistor M5, a resistor R3, a transistor M7, and a diode string 122. A current that the negative slope control circuit 120 sinks from the gate of the power switch 11 is called a sink current ISI.

The gate control signal VGC is input to a gate of the transistor M5, a source of the transistor M5 is connected to the fourth current source 121, and a drain of the transistor M5 is connected to a first end of the resistor R3. A second end of the resistor R3 is connected to the gate of the power switch 11.

The diode string 122 includes a plurality of diodes D11 to D15. The plurality of diodes D11 to D15 are connected in series, an anode of the diode D11 is connected to the gate of the power switch 11, and a cathode of the diode D15 is connected to a drain of the transistor M7. A source of the transistor M7 is connected to a ground and the gate control signal VGC is input to a gate of the transistor M7.

The number of diodes included in the diode string 122 is determined according to a threshold voltage. The threshold voltage is a voltage that determines a fluctuation time of a falling slope of the gate voltage VG, and a falling slope of the gate voltage VG before a time at which the decreasing gate voltage VG reaches the threshold voltage and a falling slope of the gate voltage VG after the time at which the gate voltage VG reaches the threshold voltage are different from each other. For example, the falling slope after the gate voltage VG reaches the threshold voltage is smooth compared to the falling slope before the gate voltage VG reaches the threshold voltage.

In the embodiment, the sink current ISI that determines the falling slope of the gate voltage VG determines a fourth mode and a fifth mode.

The transistor M5 and the transistor M7 are turned on by a high-level gate control signal VGC. Then, a current IS2 of the fourth current source 121 flows to the ground through the turn-on transistor M5 and the resistor R3. In addition, the transistor M7 is turned on, a current flowing to the ground from the gate of the power switch 11 is generated for a period during which the diode string 122 is turned on.

Hereinafter, operation of the negative slope control circuit 120 will be described in detail with reference to FIG. 7.

Figure 7:
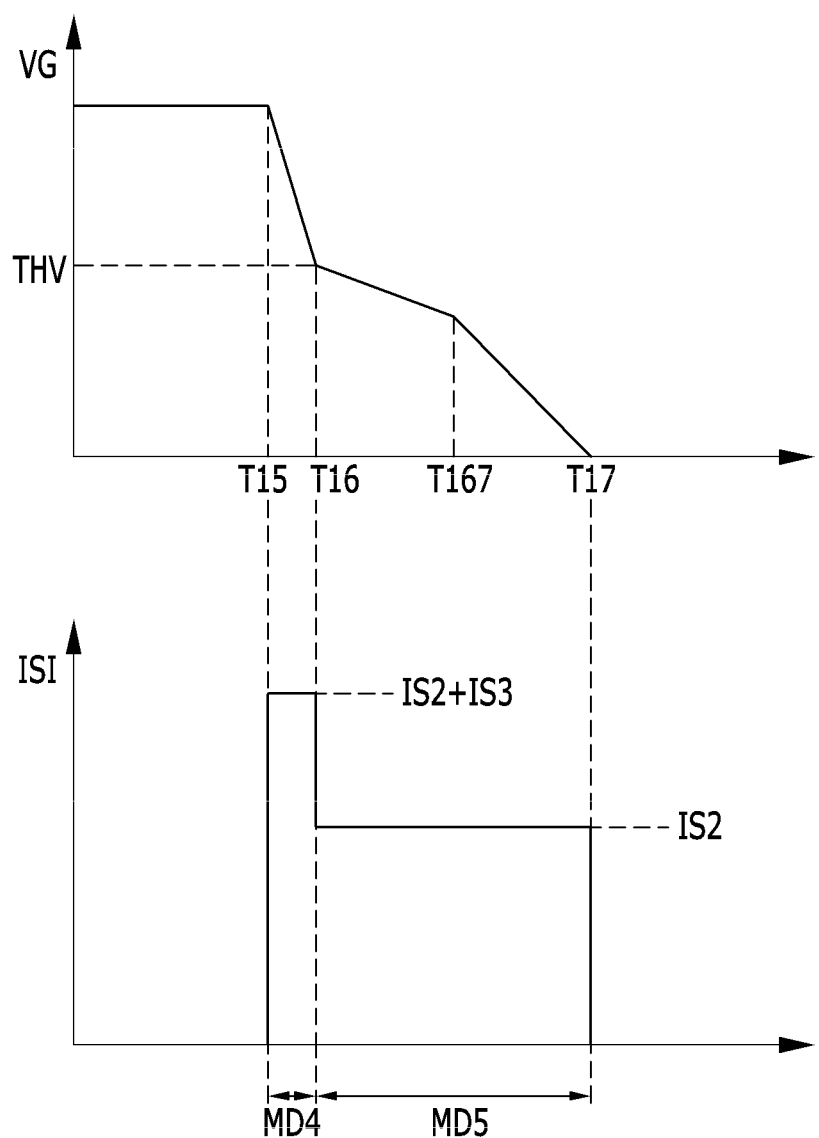
FIG. 7 shows a gate current and a sink current according to the embodiment.

FIG. 7 shows the gate voltage and the sink current according to the embodiment.

At T15, the gate control signal VGC is increased to high level and the transistor m5 and the transistor M7 are turned on. Then, the current IS2 and a current IS3 flowing through the diode string 122 flow. In this case, the sink current ISI is the sum of the current IS2 and the IS3, the sink current ISI is IS2+IS3 in the fourth mode MD4. The gate voltage VG is rapidly decreased from T15 by the sink current ISI.

When the decreasing gate voltage VG reaches the threshold voltage THV at T16, the diode string 122 is turned off. Then, the sink current ISI becomes the current IS2, and the sink current ISI is the current IS2 in the fifth mode MD5. From T16, the falling slope of the gate voltage VG is decreased. At T17 at which the gate voltage VG reaches zero voltage, the current IS2 does not flow.

For a period T16 to T167 during which a miller capacitor of the MOSFET that forms the power switch 11 is discharged, the falling slope of the gate voltage VG is smoother than the falling slope of the gate voltage during a period T167 to T17. After T167, no miller capacitor exists in the input capacitance and the falling slope of the gate voltage VG becomes steeper than the falling slope of the gate voltage VG during the period T16 to T167 by the sink current ISI of the fifth mode MD5.

As described, in the embodiment, the falling slope of the gate voltage VG is gradually changed. Then, EMI that may be generated by the hard switching at the turn-off of the power switch 11 also can be suppressed.

Hereinafter, another embodiment will be described with reference to FIG. 8.

Figure 8:
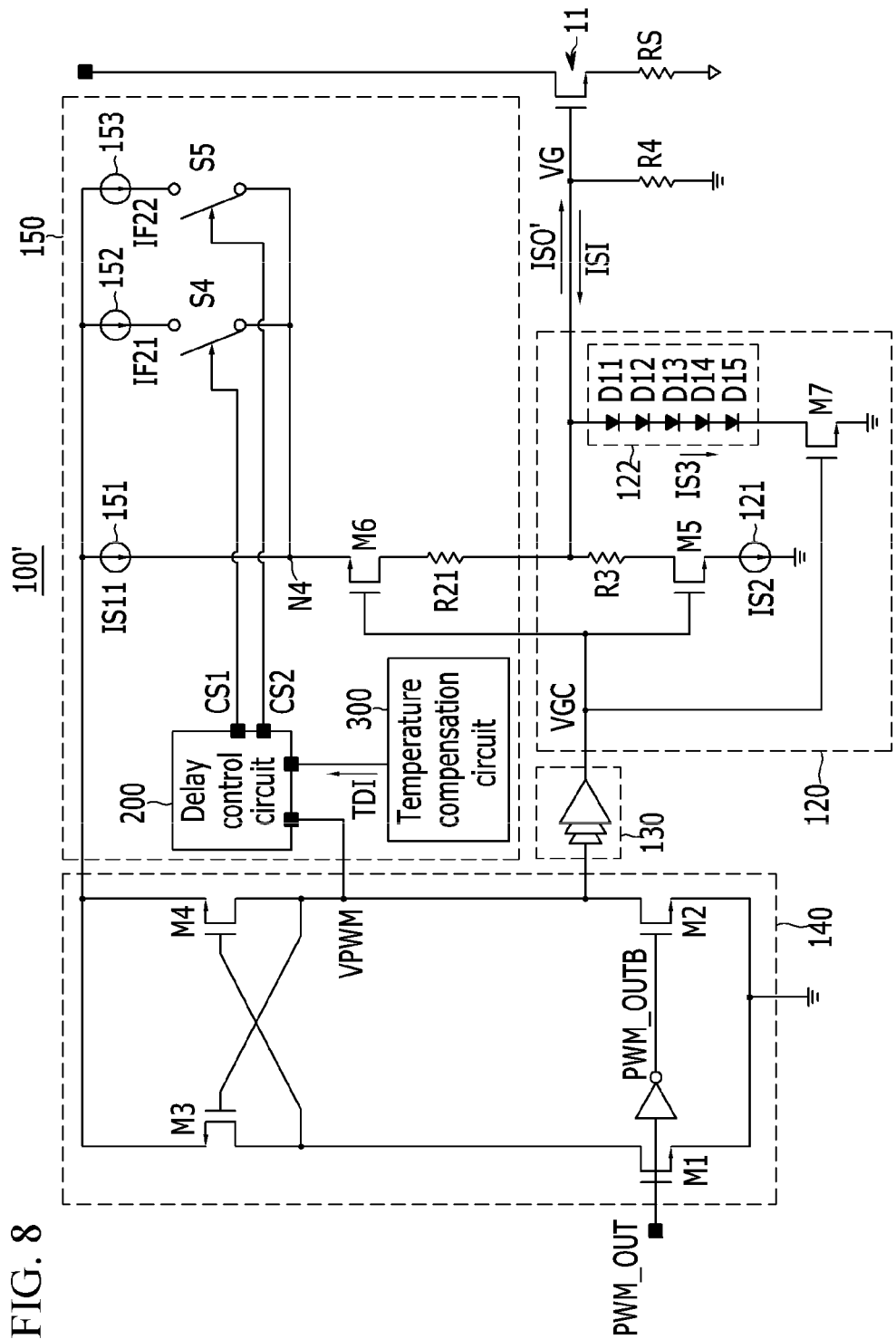
FIG. 8 shows a gate driving circuit according to another embodiment.

FIG. 8 shows a gate driving circuit according to the other embodiment.

A positive slope control circuit 150 of a gate driving circuit 100' according to the other embodiment is different from the positive slope control circuit 110 of the gate driving circuit 100 of the previous embodiment.

In detail, a delay control circuit 200 and a temperature compensation circuit 300 of the positive slope control circuit 150 are the same as those in the previous embodiment.

In the other embodiment, a gate voltage VG and a source current ISO' having waveforms that are similar to the waveforms shown in FIG. 6 can be generated according to the first and second control signals CS1 and CS2 by properly setting fourth and sixth current sources 151, 152, and 153 and a resistor R21.

The first control signal CS1 controls a switching operation of a slope control switch S4, and for example, a slope control switch S4 is turned on by a high-level first control signal CS1. The second control signal CS2 controls a switching operation of a slope control switch S5, and for example, a slope control switch S5 is turned on by a high-level second control signal CS2.

In the previous embodiment, a configuration that varies resistance on a path of the source current ISO according to an OR operation performed on the first control signal and the second control signal CS1 and CS2 is included. However, in the other embodiment, resistance on a path through which the source current ISO' supplied from the positive slope control circuit 110 is not varied.

As shown in FIG. 8, a first end of the resistor R21 is connected to a drain of the transistor M6 and a second end of the resistor R21 is connected to a gate of a power switch 11. The transistor M6 is turned on by a low-level gate control signal VGC.

During the turn-on period of the transistor M6, when the slope control switch S4 is turned on by the first control signal CS1, the sum of a current IS11 of the fourth current source 151 and a current IF21 of the fifth current source 152 flows to the gate of the power switch 11 through the resistor R21. In this case, source current ISO' is IS11+IF21. Which the slope control switch S4 and the slope control switch S5 are turned off by the first and second control signals CS1 and CS2, the current IS11 of the fourth current source 151 flows to the gate of the power switch 11 through the resistor R21. In this case, the source current ISO' is IS11. When the slope control switch S5 is turned on by the second control signal CS2, the sum of the current IS11 of the fourth current source 151 and the current IF22 of the sixth current source 153 flows to the gate of the power switch 11 through the resistor R21. In this case, the source current ISO' is IS11+IF22.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1
switch control circuit 10
transformer 20
feedback circuit 30
power supplying circuit 40
primary wire CO1
secondary wire CO2
power switch 11
PWM controller 12
gate driving circuit 100 100'
resistor RF, R1-R4, R11, R21, RCC
shunt regulator SR
Photodiode PD
photo transistor PT
capacitor C3 and C4
smoothing capacitor C1
start resistor Rstr
auxiliary wire CO3
rectification diode D1 and D2
positive slope control circuit 110 and 150
negative slope control circuit 120
fan-out circuit 130
level shifter 140
NMOSFET M1 and M2
PMOSFET M3 and M4
Current source 111-113, 151-153,
slope control switch (S1-S5)
OR gate 114
transistor (M5, M6, M10-M14, M16_1-M16_$n$)
delay control circuit 200
temperature compensation circuit 300
operation amplifier 301
current mirror circuit 211, 212 and 303
variable resistor 302
inverter (201-203, INV_1-INV_n)
NOR gate 204
AND gate 205
first delay circuit 210
second delay circuit 220
output capacitor C2

What is claimed is:

1. A gate driving circuit for generating a gate voltage of a power switch, comprising
   a delay control circuit configured to generate a first control signal to control a rising slope of the gate voltage at a first time after a first delay period is passed from a rising time of the gate voltage and generate a second control signal to control the rising slope of the gate voltage at a second time after a second delay period is passed from the first time; and
   a temperature compensation circuit configured to vary the first delay period according to a temperature.

2. The gate driving circuit of claim 1, wherein the delay control circuit comprises:
   a first delay circuit configured to generate a second input signal by delaying a first input signal that corresponds to a pulse width control signal for controlling a switching operation of the power switch by the first delay period;
   a second delay circuit configured to generate a third input signal by delaying the second input signal by the second delay period; and
   delay control circuitry to generate the first control signal based on the second input signal and an inverse of the first input signal and generate the second control signal based on the first input signal and the third input signal.

3. The gate driving circuit of claim 2, wherein the delay control circuit further comprises
   a first logic gate configured to enable the first control signal when both of the inverse input signal and the second input signal are at a first level; and
   a second logic gate configured to enable the second control signal when both of the first input signal and the third input signal are at a second level.

4. The gate driving circuit of claim 3, wherein the first logic gate is a NOR gate and the second logic gate is an AND gate; and
   the first level is low level, the second level is high level and an enable level is high level.

5. The gate driving circuit of claim 2, further comprising:
   a level shifter configured to generate a pulse width voltage by level-shifting the pulse width control signal, wherein the delay control circuit further comprises:
   a first inverter configured to receive the pulse width voltage and invert the pulse width voltage; and
   a second inverter configured to generate the first input signal by receiving an output of the first inverter and invert the output of the first inverter.

6. The gate driving circuit of claim 2, wherein the temperature compensation circuit comprises:
   a variable resistor of which resistance is varied according to a temperature;

an operational amplifier configured to amplify a difference between a voltage generated in the variable resistor and a predetermined bias voltage and output the amplified difference;
   a transistor including a gate to which an output of the operation amplifier is supplied, the transistor being coupled to the variable resistor; and
   a first current mirror circuit also coupled to the transistor and configured to generate a temperature detection signal by mirroring a current flowing to the transistor.

7. The gate driving circuit of claim 6, wherein the first delay circuit is further configured to generate a plurality of driving currents by mirroring the temperature detection signal and control the first delay period according to the plurality of driving currents.

8. The gate driving circuit of claim 7, wherein the first delay circuit comprises:
   a second current mirror circuit configured to mirror the temperature detection signal;
   a third current mirror circuit configured to generate the plurality of driving currents by mirroring the current mirrored by the second current mirror circuit; and
   delay generation circuitry configured to determine the first delay period by controlling a plurality of output delays using the plurality of driving currents and a plurality of capacitors, receive the first input signal and output the second input signal.

9. The gate driving circuit of claim 8, wherein the delay generation circuitry comprises a plurality of inverters for receiving the plurality of driving currents, wherein an input end of each of the plurality of inverters is coupled to an output end of an inverter of a previous stage, the plurality of inverters receiving the first input signal as an input and generating the second input signal as an output.

10. The gate driving circuit of claim 1, further comprising:
   a first current source configured to supply a first current;
   a first slope control switch configured to be switched according to the first control signal;
   a second slope control switch configured to be switched according to the second control signal;
   a second current source of which a first end is coupled to the first slope control switch and configured to supply a second current;
   a third current source of which a first end is coupled to the second slope control switch and configured to supply a third current; and
   a transistor coupled to a gate of the power switch to which a gate control signal corresponding to a pulse width control signal that controls switching operation of the power switch is input, the first slope control switch and the second slope control switch.

11. The gate driving circuit of claim 10, further comprising a first resistor coupled between the transistor and the gate of the power switch.

12. The gate driving circuit of claim 11, further comprising a second resistor configured to be coupled in series with the first resistor; and
   a third slope control switch configured to be coupled in parallel with the second resistor, wherein the third slope control switch is configured to be turned on when at least one of the first control signal and the second control signal is an enable signal.

13. The gate driving circuit of claim 1, further comprising a negative slope control circuit configured to control a falling slope of the gate voltage at a third time after a third delay period is passed from a falling time of the gate voltage.

14. The gate driving circuit of claim 13, wherein the negative slope control circuit comprises:
   a fourth current source configured to supply a fourth current;
   a first transistor coupled to a gate of the power switch to which a gate control signal corresponding to a pulse width control signal that controls switching operation of the power switch is input and the fourth current source;
   a second transistor including a gate to which the gate control signal is input; and
   a diode string configured to be coupled between the second transistor and the gate of the power switch.

15. The gate driving circuit of claim 14, wherein the number of diodes included in the diode string is determined according to a threshold voltage that determines a fluctuation time of a falling slope of the gate voltage.

16. A switch control circuit comprising:
   a power switch; and
   a gate driving circuit configured to generate a gate voltage supplied to a gate of the power switch, control a rising slope of the gate voltage at a first time after a first delay period is passed from a rising time of the gate voltage, and control the rising slope of the gate voltage at a second time after a second delay period is passed from the first time, wherein the first delay period varies according to a temperature.

17. The switch control circuit of claim 16, wherein the gate driving circuit is further configured to control a first level of a source current supplied to a gate of the power switch during the first delay period and a second level of the source current during the second delay period, wherein the first level of the source current is different from the second level of the source current.

18. The switch control circuit of claim 17, wherein the gate driving circuit is further configured to control a third level of the source current to be different from the second level of the source current from a time after the first delay period and the second delay period have passed.

19. The switch control circuit of claim 16, wherein the gate driving circuit is further configured to control a falling slope of the gate voltage at a third time after a third delay period is passed from a falling time of the gate voltage.

20. The switch control circuit of claim 19, wherein a falling slope of the gate voltage is changed after the third time by variation of an input capacitance of a MOSFET that forms the power switch.

21. The switch control circuit of claim 20, wherein the rising slope of the gate voltage is changed between from the first time to a time after the second delay period is passed by variation of the input capacitance of the MOSFET that forms the power switch.

22. A power supply comprising:
   a power switch;
   a transformer including a primary side wire coupled to the power switch and a secondary side wire coupled to an output end of the power supply; and
   a switch control circuit configured to receive an output voltage of the output end, generate a pulse width control signal to control switching operation of the power switch using a sense voltage that senses a drain current flowing to the power switch, generate a gate voltage according to the pulse width control signal, control a rising slope of the gate voltage at a first time after a first delay period is passed from a rising time of the gate voltage, and control the rising slope of the gate voltage at a second time after a second delay period is passed from the first time.

23. The power supply of claim 22, wherein the switch control circuit is further configured to compensate for fluctuation of a threshold voltage by changing the first delay period according to a temperature.

24. The power supply of claim 22, wherein the switch control circuit is further configured to control a falling slope of the gate voltage at a third time after a third delay period is passed from a falling time of the gate voltage.

* * * * *